US008863957B2

(12) United States Patent
Kusuhara et al.

(10) Patent No.: US 8,863,957 B2
(45) Date of Patent: Oct. 21, 2014

(54) WAFER SEPARATION APPARATUS, WAFER SEPARATION AND TRANSFER APPARATUS, WAFER SEPARATION METHOD, WAFER SEPARATION AND TRANSFER METHOD, AND SOLAR CELL WAFER SEPARATION AND TRANSFER METHOD

(75) Inventors: Ichiki Kusuhara, Tokyo (JP); Kyouhei Tsunashima, Saitama (JP)

(73) Assignee: Kabushiki Kaisha Watanabe Shoko, Tokyo (JP)

( * ) Notice: Subject to any disclaimer, the term of this patent is extended or adjusted under 35 U.S.C. 154(b) by 543 days.

(21) Appl. No.: 13/144,198

(22) PCT Filed: Jan. 12, 2010

(86) PCT No.: PCT/JP2010/050233
§ 371 (c)(1),
(2), (4) Date: Sep. 20, 2011

(87) PCT Pub. No.: WO2010/082567
PCT Pub. Date: Jul. 22, 2010

(65) Prior Publication Data
US 2012/0006726 A1 Jan. 12, 2012

(30) Foreign Application Priority Data
Jan. 13, 2009 (JP) ................................ 2009-004709

(51) Int. Cl.
*B07C 5/02* (2006.01)
*B28D 5/00* (2006.01)
*H01L 21/67* (2006.01)
*H01L 31/18* (2006.01)
*H01L 21/02* (2006.01)

(52) U.S. Cl.
CPC .............. *H01L 31/18* (2013.01); *B28D 5/0082* (2013.01); *H01L 21/67057* (2013.01); *H01L 21/02052* (2013.01); *H01L 21/67092* (2013.01)
USPC .............. 209/3.1; 134/25.4; 134/36; 134/184

(58) Field of Classification Search
USPC .................. 209/3.1; 134/25.4, 36, 184, 306.6
See application file for complete search history.

(56) References Cited

U.S. PATENT DOCUMENTS

| 5,950,643 | A | 9/1999 | Miyazaki et al. |
| 6,875,289 | B2 * | 4/2005 | Christenson et al. ........... 134/36 |
| 2004/0050405 | A1 * | 3/2004 | Christenson et al. ........ 134/25.4 |
| 2004/0050408 | A1 * | 3/2004 | Christenson et al. ......... 134/184 |
| 2007/0151576 | A1 * | 7/2007 | Christenson et al. ............. 134/2 |
| 2008/0146003 | A1 | 6/2008 | Wang et al. |

FOREIGN PATENT DOCUMENTS

| DE | 199 04 834 | 8/2000 |
| DE | 10 2006 011 870 | 9/2007 |

(Continued)

OTHER PUBLICATIONS

International Search Report, PCT/JP2010/050233, Apr. 20, 2010.

*Primary Examiner* — Terrell Matthews
(74) *Attorney, Agent, or Firm* — Young & Thompson

(57) ABSTRACT

A wafer separation apparatus improves wafer separation performance in separation and transfer and suppresses the occurrence of wafer breakage in separation and transfer, while remaining inexpensive and small. The apparatus includes: a cassette that vertically accommodates a large number of single wafers in intimate contact with each other, the cassette being at least vertically opened; a cassette support that removably supports the cassette, the cassette support being at least vertically opened; a hoisting unit that hoists and lowers the cassette support integrally with the cassette; a liquid bath that accommodates a liquid into which the cassette support is immersed integrally with the cassette when the hoisting unit descends; a nozzle in the inside of the liquid bath to issue micro bubbles from the underside of the cassette support toward a large number of the wafers; and a micro bubble generator that generates micro bubbles to be issued from the nozzle.

12 Claims, 12 Drawing Sheets

(56) References Cited

FOREIGN PATENT DOCUMENTS

| EP | 0 762 483 | 1/1999 |
|---|---|---|
| JP | 8-139159 | 5/1996 |
| JP | 9-237770 | 9/1997 |
| JP | 2000-311877 | 11/2000 |
| JP | 2003-100703 | 4/2003 |
| JP | 2006-310456 | 11/2006 |

* cited by examiner

WAFER SEPARATION APPARATUS, WAFER SEPARATION AND TRANSFER APPARATUS, WAFER SEPARATION METHOD, WAFER SEPARATION AND TRANSFER METHOD, AND SOLAR CELL WAFER SEPARATION AND TRANSFER METHOD

TECHNICAL FIELD

The present invention relates to a wafer separation apparatus, a wafer separation and transfer apparatus, a wafer separation method, a wafer separation and transfer method, and a solar cell wafer separation and transfer method that separate a batch of single wafers.

BACKGROUND ART

Patent Document 1: JP09-237770A
Patent Document 2: JP11-214336A1
Patent Document 3: JP11-233461A In these years, demands for solar cells are rapidly increasing because of a growing awareness of energy problems such as exhaustion of fossil fuel sources and environmental problems such as global warming.

In these demands, for silicon possibly to be the cells for solar batteries, such high purity silicon is demanded that the purity is 99.9999% or more and the resistivity is 0.5 Ω·cm or more, and off-specification products have been used for raw materials, which are produced in fabricating high purity silicon used in semiconductor industries, or in fabricating substrates for IC, LSI, etc.

However, particularly in the solar cell, because a single solar cell module is fabricated using about 54 rectangular silicon wafers with a five-inch side, the used amount is more enormous than the used amount of silicon wafers for IC, LSI, or the like, high purity silicon for semiconductors is expensive, and the yield of off-specification products is small, causing a problem in that there is a limit to the amount of silicon materials supplied for the solar cell.

In addition, problems have not arisen so far because the yield of off-specification products of electronic device silicon exceeds the demand of the solar cell. However, the demand of the solar cell is exceeding the yield of off-specification products of electronic device silicon today, causing a serious problem of shortage of raw materials for solar cell silicon.

On the other hand, because the solar cell silicon wafer with a rough surface can surely provide the surface area, the surfaces of wafers, which are single wafers after a silicon ingot is sliced with a wire-saw, are not polished in mirror finish like semiconductor wafers.

Thus, in the fabrication process of the semiconductor wafer, a large-sized, expensive separation and transfer apparatus is used to carry single wafers to a machine for the subsequent process step (surface finishing process or the like). However, the real situation in the fabrication process of the solar cell wafer was that wafers are manually separated one by one without using an expensive, large-sized separation and transfer apparatus, which affects product costs as well.

On the other hand, in consideration of the above-mentioned problems of shortage of raw materials for solar cell silicon, raw material costs, or the like, the solar cell wafer is also being reduced in thickness like the semiconductor wafer, and manual one by one separation in the fabrication process of the solar cell wafer tends to cause breakage or the like. Because of this, there is an increasing demand for small-sized, inexpensive separation apparatuses.

Now, a large number of wafers, which are sliced from an ingot formed in an almost cylindrical shape and attached to a support plate using a wire-saw, are pre-washed in a pre-washing device as the wafers are in a cylindrical pack attached to the support plate in order to remove slurry, cutting dust, or the like. After the pre-washed wafers are removed from the support plate using a removing device in order to remove the wafers from the support plate for single wafers, the wafers are separated into individual wafers in a separation and transfer apparatus, and then carried to the subsequent process step.

At this time, ultrasonic cleaning techniques are known in which slurry, cutting dust, or the like attached to wafers is removed with air bubbles generated by a pre-washing device (for example, see Patent Documents 1 to 3).

Although ultrasonic washing is effective for washing the side surfaces and two end surfaces of the silicon ingot, there is a problem in that it is difficult to cause a washing fluid to reach the back of the space between the sliced wafers, and slurry, cutting dust, or the like attached to the wafer surface cannot be completely removed, resulting in degraded washing effect.

Then, in removing the pre-washed wafers from the support plate using the removing device (single wafer separation), they are immersed in a liquid solution such as acetic acid or the like for removing the wafers from the support plate and they are simultaneously subjected to secondary washing for removing remaining slurry, cutting dust, etc.

However, the individual single wafers after secondary washing are in intimate contact with each other in a horizontally stacked state (piled state) when carried, so that there is a problem in that it is difficult to reliably perform separating operations because the initial resistance for separating a stationary wafer at the topmost position from a wafer therebelow (directly therebelow) is static frictional resistance greater than dynamic frictional resistance.

Then, in the above-mentioned Patent Document 1, there is disclosed that two jet nozzles that blow water upward are provided in the inner lower part of a chuter in a separation and transfer apparatus, pressure water is spouted from the jet nozzles through the space between the chuter and stacked wafers, and this causes the topmost wafer to be slightly lifted by the spouted pressure water when the topmost wafer is carried to the top side of the chuter for performing smooth wafer separating operations because the adhesion between the topmost wafer and the wafer directly therebelow is reduced.

SUMMARY OF THE INVENTION

Problems that the Invention is to Solve

However, in the above-mentioned separation and transfer apparatus, problems have arisen that it is likely that wafers are chipped in blowing pressure water to the wafers, which are being reduced in thickness, and it is likely that if a wafer in the subsequent layer is located at the position on the downstream side of the transfer direction more than a topmost wafer is located, the second topmost wafer is also floated together with the topmost wafer and carried together as they are not separated.

Then, in consideration of the forgoing circumstances, it is an object of the present invention to provide a wafer separation apparatus that can improve wafer separation performance in separation and transfer and can suppress the occurrence of breakage or the like of wafers in separation and transfer, while the apparatus is an inexpensive, small-sized apparatus.

Method for Solving the Problems

A wafer separation apparatus according to the present invention is characterized by including: a cassette configured to vertically accommodate therein a large number of single wafers in intimate contact with each other, the cassette being at least vertically opened; a cassette support configured to removably support the cassette, the cassette support being at least vertically opened; a hoisting unit configured to hoist and lower the cassette support integrally with the cassette; a liquid bath configured to accommodate a liquid thereinside into which the cassette support is immersed integrally with the cassette when the hoisting unit descends; a nozzle provided in the inside of the liquid bath for issuing micro bubbles from an underside of the cassette support toward a large number of the wafers; and a micro bubble generator configured to generate micro bubbles to be issued from the nozzle.

In accordance with the wafer separation apparatus according to the present invention, it is possible to improve wafer separation performance, and it is possible to suppress the occurrence of breakage or the like of wafers, while the apparatus is an inexpensive, small-sized apparatus.

A wafer separation and transfer apparatus according to the present invention is characterized by including: a cassette configured to vertically accommodate therein a large number of single wafers in intimate contact with each other, the cassette being at least vertically opened; a cassette support configured to removably support the cassette, the cassette support being at least vertically opened; a hoisting unit configured to hoist and lower the cassette support integrally with the cassette; a rotating unit provided on the hoisting unit for rotating the cassette support integrally with the cassette so as to switch the wafers accommodated in the cassette between a state in which the wafers are vertically arranged and a state in which the wafers are horizontally arranged; a liquid bath configured to accommodate a liquid thereinside into which the cassette support is immersed integrally with the cassette when the hoisting unit descends; a nozzle provided in the inside of the liquid bath for issuing micro bubbles from an underside of the cassette support toward a large number of the wafers; a micro bubble generator configured to generate micro bubbles to be issued from the nozzle; an unloading member configured to unload a topmost wafer from the horizontally arranged wafers hoisted from the inside of the liquid bath; and a carrier unit configured to carry the topmost wafer unloaded by the unloading member.

In accordance with the wafer separation and transfer apparatus according to the present invention, it is possible to improve wafer separation performance in separation and transfer, and it is possible to suppress the occurrence of breakage or the like of wafers in separation and transfer, while the apparatus is an inexpensive, small-sized apparatus.

Moreover, the wafer separation and transfer apparatus according to the invention is characterized in that the carrier unit includes: a defect determining device provided near an upstream side of a transfer path for determining a defect on a wafer being carried; a diverging device provided on a downstream side of the transfer path more than the defect determining device for diverging a wafer determined that the wafer has a defect to a discard route different from a carrying route; and a collecting device configured to collect a wafer determined that the wafer has no defect by the defect determining device.

In accordance with the wafer separation and transfer apparatus according to the invention, if a separated wafer has any defects, it is possible to eject (remove) the wafer in the carrying process.

Furthermore, the wafer separation apparatus or the wafer separation and transfer apparatus according to the invention is characterized by including a moving unit configured to move the nozzle or the cassette support along a direction of arranging the wafers.

In accordance with the wafer separation apparatus or the wafer separation and transfer apparatus according to the invention, it is possible to uniformly issue micro bubbles toward each space between the wafers.

In addition, the wafer separation apparatus or the wafer separation and transfer apparatus according to the invention is characterized by including a cover configured to cover five sides except the underside of the cassette support as the cassette support is immersed in the inside of the liquid bath.

In accordance with the wafer separation apparatus or the wafer separation and transfer apparatus according to the invention, it is possible to facilitate causing micro bubbles to enter each space between the wafers.

The wafer separation apparatus or the wafer separation and transfer apparatus according to the invention is characterized in that the micro bubble generator causes the nozzle to issue negatively charged micro bubbles.

In accordance with the wafer separation apparatus or the wafer separation and transfer apparatus according to the invention, it is possible to cause micro bubbles to enter the space between the wafers so that the micro bubbles are brought into the space, if the space between the wafers after sliced with a wire-saw is positively charged.

The wafer separation apparatus or the wafer separation and transfer apparatus according to the invention is characterized in that the micro bubble generator causes the nozzle to issue a micro bubble having a diameter equal to a width of a groove or less, the groove being cut with a wire-saw used in slicing a silicon ingot into single wafers.

In accordance with the wafer separation apparatus or the wafer separation and transfer apparatus according to the invention, typically, the groove width of a groove formed between the wafers is the wire diameter of the wire-saw or more. Thus, it is made possible to cause micro bubbles to enter the space between the wafers by issuing micro bubbles having an air bubble diameter equal to this groove width or less.

The wafer separation apparatus or the wafer separation and transfer apparatus according to the invention is characterized in that the micro bubble generator causes the nozzle to issue a micro bubble having a diameter equal to a wire diameter of a wire-saw or less, the wire-saw being used in slicing a silicon ingot into single wafers.

In accordance with the wafer separation apparatus or the wafer separation and transfer apparatus according to the invention, typically, the groove width of a groove formed between the wafers is the wire diameter of the wire-saw or more. Thus, it is made possible to more reliably cause micro bubbles to enter the space between the wafers by issuing micro bubbles having the air bubble diameter equal to the wire diameter or less, based on the wire diameter.

The wafer separation apparatus or the wafer separation and transfer apparatus according to the invention is characterized in that the micro bubble generator causes the nozzle to issue a micro bubble having a diameter of 100 μm or less.

In accordance with the wafer separation apparatus or the wafer separation and transfer apparatus according to the invention, the wire diameter of a wire used for the wire-saw ranges from 100 to 150 μm. Thus, it is made possible to reliably cause micro bubbles to enter the space between the wafers without providing special design changes or the like by generating micro bubbles having the air bubble diameter, based on the minimum diameter of the wire.

The wafer separation apparatus or the wafer separation and transfer apparatus according to the invention is characterized in that the micro bubble generator causes the nozzle to issue a micro bubble having a diameter of 20 μm or less on average.

In accordance with the wafer separation apparatus or the wafer separation and transfer apparatus according to the invention, it is possible to increase the volume of an air layer for implementing more reliable separation by increasing the number of micro bubbles that enter the space between the wafers in a large number. In addition, because a large or small error occurs in the air bubble diameter of actual micro bubbles to some extent, it is possible that the mean value is determined to be the criterion of the diameter of air bubbles to be generated for defining the air bubble diameter.

The wafer separation and transfer apparatus according to the invention is characterized in that the cassette vertically accommodates therein a large number of the single wafers in intimate contact with each other so that a running direction of the wire-saw used in slicing a silicon ingot into single wafers is the same as wafer unloading and transfer directions of the unloading member and the carrier unit.

In accordance with the wafer separation and transfer apparatus according to the invention, the direction of cuts formed along the wire running direction in slicing the ingot using the wire-saw and the wafer transfer direction are made the same. Thus, it is possible to suppress the occurrence of scratches crossing the wire carrying direction in carrying the wafers.

The wafer separation and transfer apparatus according to the invention is characterized in that the rotating unit supports the cassette support so that a top edge of the wafers comes close to a vertical inner wall surface of the liquid bath in the state in which the wafers are vertically arranged and accommodated in the cassette when the cassette support is erected.

In accordance with the wafer separation and transfer apparatus according to the invention, it is possible to eliminate the event that micro bubbles entering the space between the wafers cause the individual wafers to move unexpectedly when the cassette support is erected to horizontally arrange the wafers.

A wafer separation method according to the present invention is characterized by including: an accommodating step of vertically accommodating a large number of single wafers in a cassette in intimate contact with each other, the cassette being at least vertically opened; a mounting and supporting step of mounting and supporting the cassette on a cassette support at least vertically opened; a lowering step of lowering the cassette support integrally with the cassette using a hoisting unit and immersing the wafers vertically arranged in a liquid in an inside of the liquid bath; and a micro bubble issuing step of issuing micro bubbles generated in a micro bubble generator from an underside of the cassette support toward the wafers vertically arranged and causing the micro bubbles to enter and stay in a large number of the individual wafers.

In accordance with the wafer separation method according to the present invention, it is possible to improve wafer separation performance, and it is possible to suppress the occurrence of breakage or the like of wafers, while the apparatus is an inexpensive, small-sized apparatus.

A wafer separation and transfer method according to the present invention is characterized by including: an accommodating step of vertically accommodating a large number of single wafers in a cassette in intimate contact with each other, the cassette being at least vertically opened; amounting and supporting step of mounting and supporting the cassette on a cassette support at least vertically opened; a lowering step of lowering the cassette support integrally with the cassette using a hoisting unit and immersing the wafers vertically arranged in a liquid in an inside of the liquid bath; a micro bubble issuing step of issuing micro bubbles generated in a micro bubble generator from an underside of the cassette support toward the wafers vertically arranged and causing the micro bubbles to enter and stay in each space between a large number of the wafers; a rotating step of rotating the cassette support integrally with the cassette to horizontally arrange a large number of the wafers using a rotating unit, while the micro bubbles enter and stay in each space between a large number of the wafers; a hoisting step of hoisting the cassette support integrally with the cassette as the wafers are horizontally arranged using the hoisting unit and lifting a topmost wafer above at least a liquid level of the liquid bath; an unloading step of unloading the topmost wafer lifted above the liquid level; and a carrying step of carrying the unloaded wafer.

In accordance with the wafer separation and transfer method according to the present invention, it is possible to improve wafer separation performance in separation and transfer, and it is possible to suppress the occurrence of breakage or the like of wafers in separation and transfer, while the apparatus is an inexpensive, small-sized apparatus.

A wafer separation and transfer method according to the present invention is characterized by including: an accommodating step of vertically accommodating a large number of single wafers in a cassette in intimate contact with each other after removal of the wafers, the cassette being at least vertically opened; a mounting and supporting step of mounting and supporting the cassette on a cassette support at least vertically opened; a pre-washing step of lowering the cassette support integrally with the cassette using a hoisting unit and pre-washing the wafers vertically arranged; an unloading and carrying step of unloading and carrying the cassette after pre-washed; a lowering step of immersing the carried cassette in a liquid in an inside of a liquid bath; a micro bubble issuing step of issuing micro bubbles generated in a micro bubble generator from an underside of the cassette support toward the wafers vertically arranged and causing the micro bubbles to enter and stay in each space between a large number of the wafers; a rotating step of rotating the cassette support integrally with the cassette to horizontally arrange a large number of the wafers using a rotating unit, while the micro bubbles enter and stay in each space between a large number of the wafers; a hoisting step of hoisting the cassette support integrally with the cassette as the wafers are horizontally arranged using the hoisting unit and lifting a topmost wafer above at least a liquid level of the liquid bath; an unloading step of unloading the topmost wafer lifted above the liquid level; and a carrying step of carrying the unloaded wafer.

In accordance with the wafer separation and transfer method according to the present invention, it is possible to pre-wash sliced wafers and also separate and carry the sliced wafers, and it is also possible to completely automate the operation process steps from pre-washing to separation and transfer.

A solar cell wafer separation and transfer method according to the present invention is characterized by including: a slicing step of slicing a silicon ingot integrally with a support plate into a large number of wafers; a removing step of removing the sliced silicon ingot from the support plate for single wafers; an accommodating step of vertically accommodating a large number of the single wafers in a cassette in intimate contact with each other after removal of the wafers, the cassette being at least vertically opened; a mounting and supporting step of mounting and supporting the cassette on a cassette support at least vertically opened; a lowering step of lowering the cassette support integrally with the cassette using a hoisting unit and immersing the wafers vertically arranged in a liquid in an inside of the liquid bath; a micro bubble issuing step of issuing micro bubbles generated in a micro bubble generator from an underside of the cassette support toward the wafers vertically arranged and causing the micro bubbles to enter and stay in each space between a large number of the wafers; a rotating step of rotating the cassette support integrally with the cassette to horizontally arrange a large number of the wafers using a rotating unit, while the micro bubbles enter and stay in each space between a large number of the wafers; a hoisting step of hoisting the cassette support integrally with the cassette as the wafers are horizontally arranged using the hoisting unit and lifting a topmost wafer above at least a liquid level of the liquid bath; an unloading step of unloading the topmost wafer lifted above the liquid level; a carrying step of carrying the unloaded wafer; and a transfer step of transferring the carried wafer to a solar cell fabrication apparatus.

In accordance with the solar cell wafer separation and transfer method according to the present invention, it is possible to improve wafer separation performance in separation and transfer of solar cell wafers, and it is possible to suppress the occurrence of breakage or the like of wafers in separation and transfer, while the apparatus is an inexpensive, small-sized apparatus. In addition, it is also possible that after the carried wafer is collected automatically collected in a wafer collection box in the carrying step and the wafer collection box after collected is automatically carried to the subsequent step using a multi-robot arm.

The solar cell wafer separation and transfer method according to the invention is characterized in that in the transfer step, the wafer is transferred to a chemical etching apparatus for texture treatment to fabricate a p-type wafer or n-type wafer.

The wafer separation method, the wafer separation and transfer method, or the solar cell wafer separation and transfer method according to the invention is characterized in that in the micro bubble issuing step, the nozzle or the cassette support is moved along a direction of arranging the wafers.

The wafer separation method, the wafer separation and transfer method, or the solar cell wafer separation and transfer method according to the invention is characterized in that before starting the micro bubble issuing step, five sides except the underside of the cassette support is covered with a cover as the cassette support is immersed in the inside of the liquid bath.

Effect of the Invention

The wafer separation apparatus according to the present invention can improve wafer separation performance in separation and transfer and can suppress the occurrence of breakage or the like of wafers in separation and transfer, while the apparatus is an inexpensive, small-sized apparatus.

DESCRIPTION OF REFERENCE NUMERALS AND SIGNS

Figure 1:
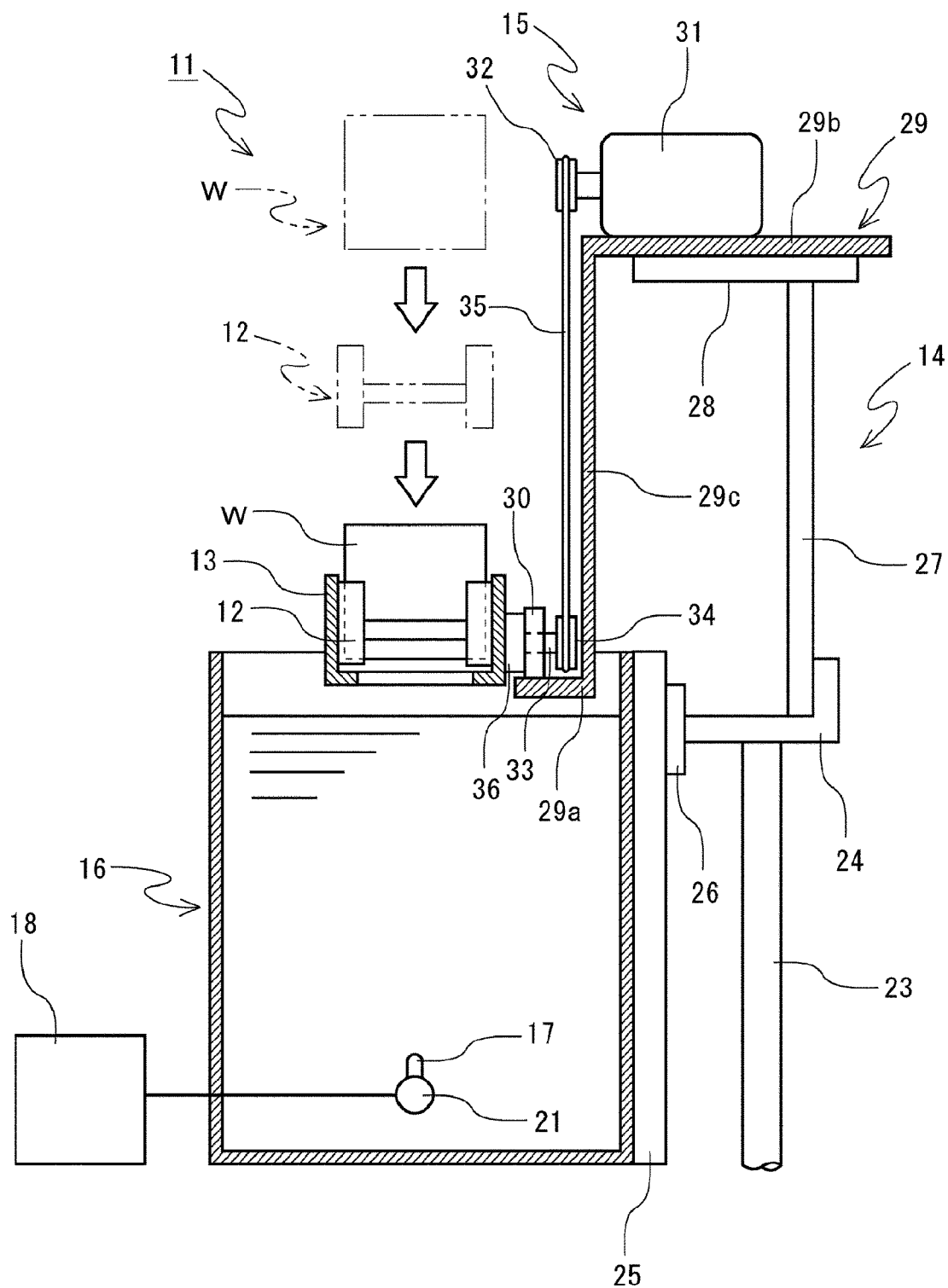
FIG. 1 is a cross sectional view depicting a wafer separation and transfer apparatus in the front side direction, including a wafer separation apparatus according to an embodiment of the present invention in which wafers are set.

1 Silicon ingot
1a Silicon waste material
1b Silicon waste material
2 Silicon block
3 Wire-saw
4 Wire
5 Wire guide
6 Wire feed pulley
7 Wire winding pulley
8 Wire winding device
9 Mount member
10 Support plate
11 Safer separation and transfer apparatus
12 Cassette
12a Lower opening
13 Cassette support
13a Lower opening
14 Hoisting unit
15 Rotating unit
16 Liquid bath
17 Nozzle 18 Micro bubble generator
19 Unloading member
20 Carrier unit
21 Moving unit
22 Cover
23 Shaft
24 Intermediate support
25 Guide rail
26 Guide plate
27 Fixed shaft
28 Fixed base
29 Support base
29a Lower plate
29b Upper plate
29c Vertical plate
30 Shaft support part
31 Drive motor
32 Drive pulley
33 Rotating shaft
34 Idler pulley
35 Endless belt
36 Rotating arm
37 Roller member
38 Transfer support plate
39 Defect determining device
40 Transfer belt conveyor
41 Diverging device
42 Collecting device
43 Cabinet
44 Servo motor
45 Drive pulley
46 Idler pulley
47 Belt
48 Ball screw
49 Hoisting and lowering member
50 Wafer collection box
51 Guide rail
52 Guide projection
53 Coupling part
61 Pre-washing bath (pre-washing device)
62 Conveying device

BEST MODE FOR CARRYING OUT THE INVENTION

Next, a wafer separation apparatus according to an embodiment of the present invention will be described with reference to the drawings. In addition, an embodiment shown below is a preferable, specific example of a wafer separation apparatus according to the present invention. For example, in some cases, technically preferable limitations are variously placed such as limitations on numeric values, materials, etc. However, the technical scope of the present invention is not limited to these modes unless otherwise noted that the present invention is limited particularly.

First, for describing the wafer separation apparatus according to an embodiment of the present invention, an exemplary fabrication process before the separation of silicon single crystal wafers will be described with reference to FIGS. 11 to 13.

Figure 11:
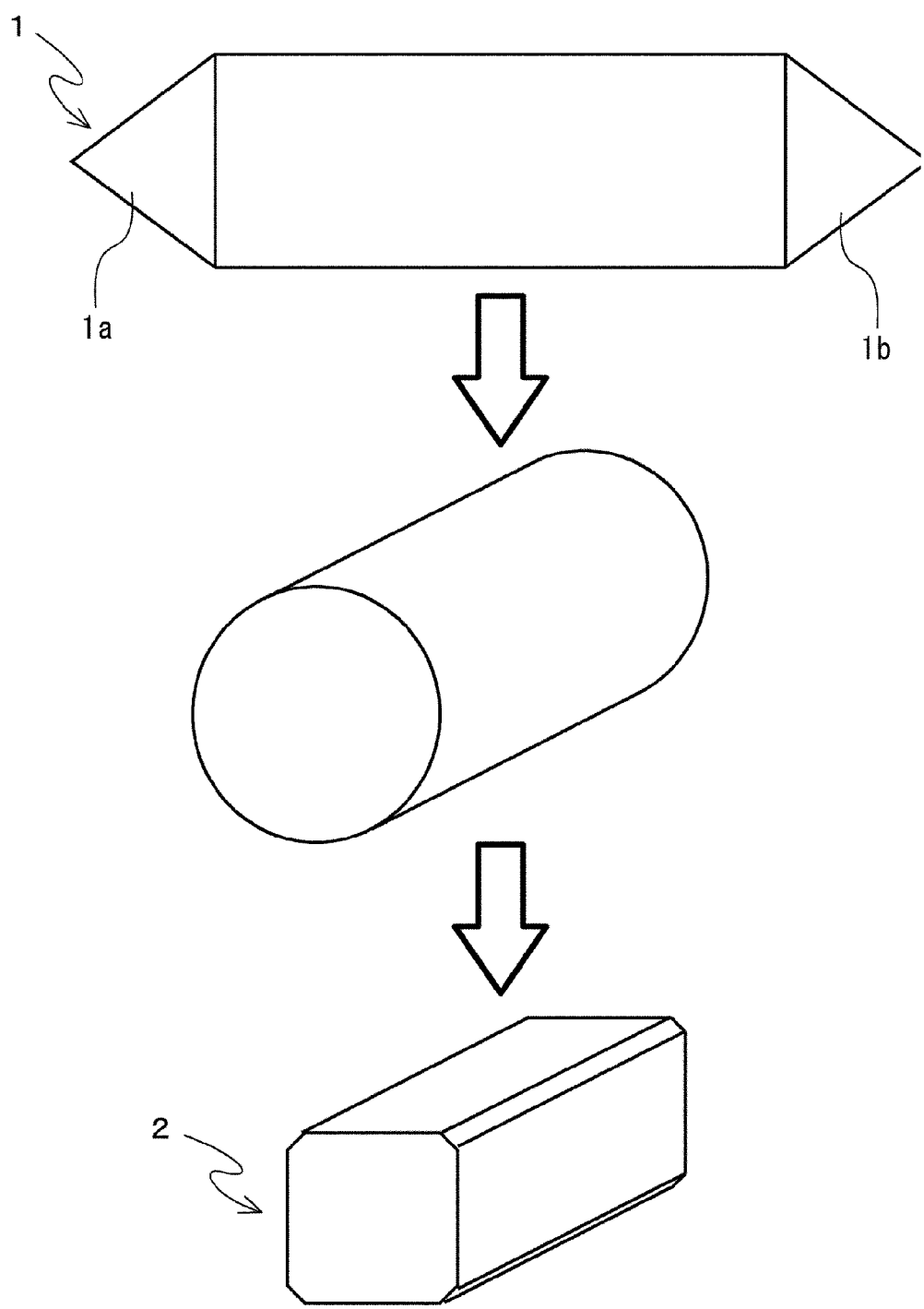
FIG. 11 is an illustration depicting the shaping process of a silicon ingot.

More specifically, as shown in FIG. 11, for the silicon single crystal wafer, a nearly cylindrical silicon ingot 1 (see the upper part in FIG. 11) integrally has a silicon waste material in a nearly conical shape at the left and right end (the upper and lower end in growing the ingot), which was produced by the Czochralski method (pulling method) or the like, silicon waste materials 1a and 1b are cut off, and the ingot 1 is cut out in a suitable size (length) as necessary (see in the middle part in FIG. 11). A silicon block 2 in a prism having a nearly rectangular cross section (each corner is beveled in some cases) is then obtained from a cylinder using a band saw or the like (see the lower part in FIG. 11).

More specifically, in fabricating silicon wafers for solar cells, the cross sectional shape of the silicon block 2 is preferably in a rectangle or nearly rectangle, and one cut out of the silicon ingot 1 is preferable.

Figure 12:
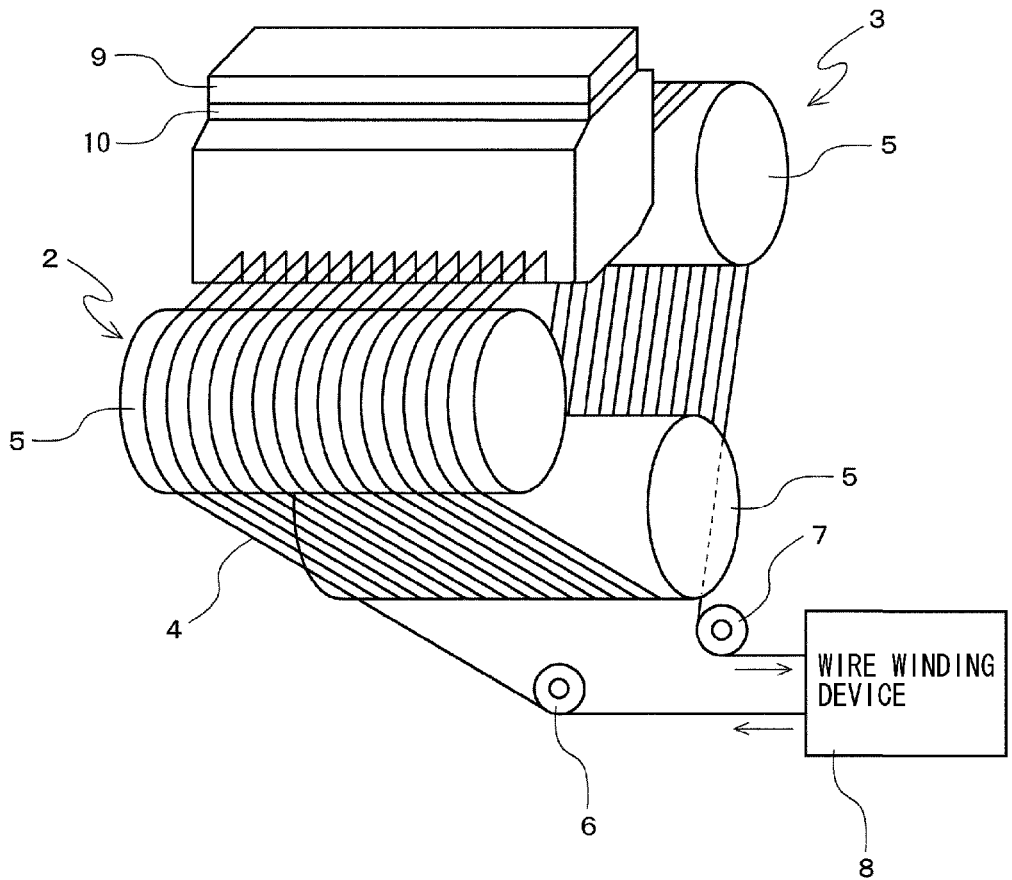
FIG. 12 is an illustration depicting a silicon ingot being sliced.

Subsequently, as shown in FIG. 12, the silicon block 2 is sliced into a large number of wafers using a wire-saw 3.

This wire-saw slices the silicon block 2 into a large number of wafers, in which a plurality of wire guides 5 (for example, three guides) with a cutting wire 4 spirally wound thereon along a plurality of grooves are rotated to run the wire 4 while slurry that is a mixed solution of oil and abrasive grains is discharged from a slurry nozzle, not shown, and cutting feed is provided between the wire 4 and the silicon block 2 in this state.

In addition, in FIG. 12, 6 denotes a wire feed pulley, 7 denotes a wire winding pulley, and 8 denotes a wire winding device.

Moreover, in slicing the silicon block 2 using the wire 4, for example, a support plate 10 made of glass or the like is mounted on amount member 9, which is made of stainless steel or the like and provided on a block hoisting support device, not shown, and the top side of the silicon block 2 is bonded and fixed to the underside of the support plate 10 through an adhesive, not shown. Furthermore, in slicing with the wire 4, cutting grooves are partially provided to the lower part of the support plate 10 in order to facilitate the separation of the individual sliced wafers into single wafers.

Figure 13:
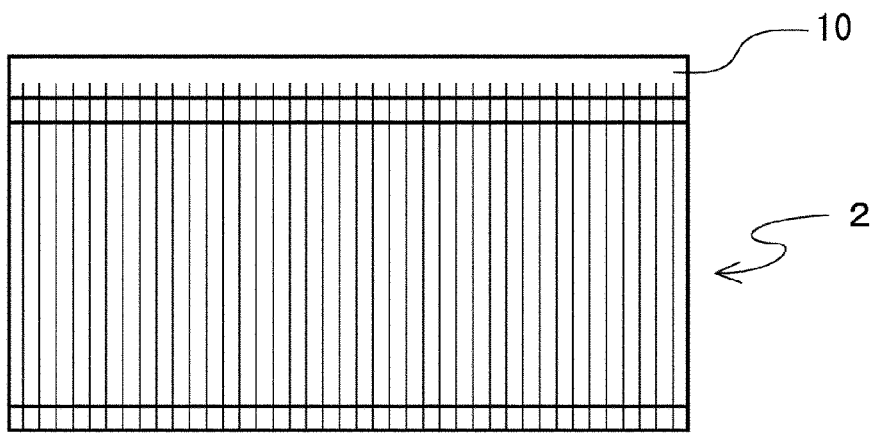
FIG. 13 is an illustration depicting a silicon ingot before separated (batch).

After that, the support plate 10 is demounted from the mount member 9, and then the silicon block 2 with cutting grooves is obtained, which is a cylindrical pack of wafers attached to the support plate 10 as shown in FIG. 13.

This silicon block 2 is pre-washed in a pre-washing device, not shown, for removing slurry, cutting dust, or the like as the cylindrical pack of wafers is attached to the support plate 10, and then the support plate 10 is removed from the silicon block 2 by secondary washing for single wafers.

In the following, transfer performed by the wafer separation apparatus according to an embodiment of the present invention will be described with reference to FIGS. 1 to 7.

Figure 2:
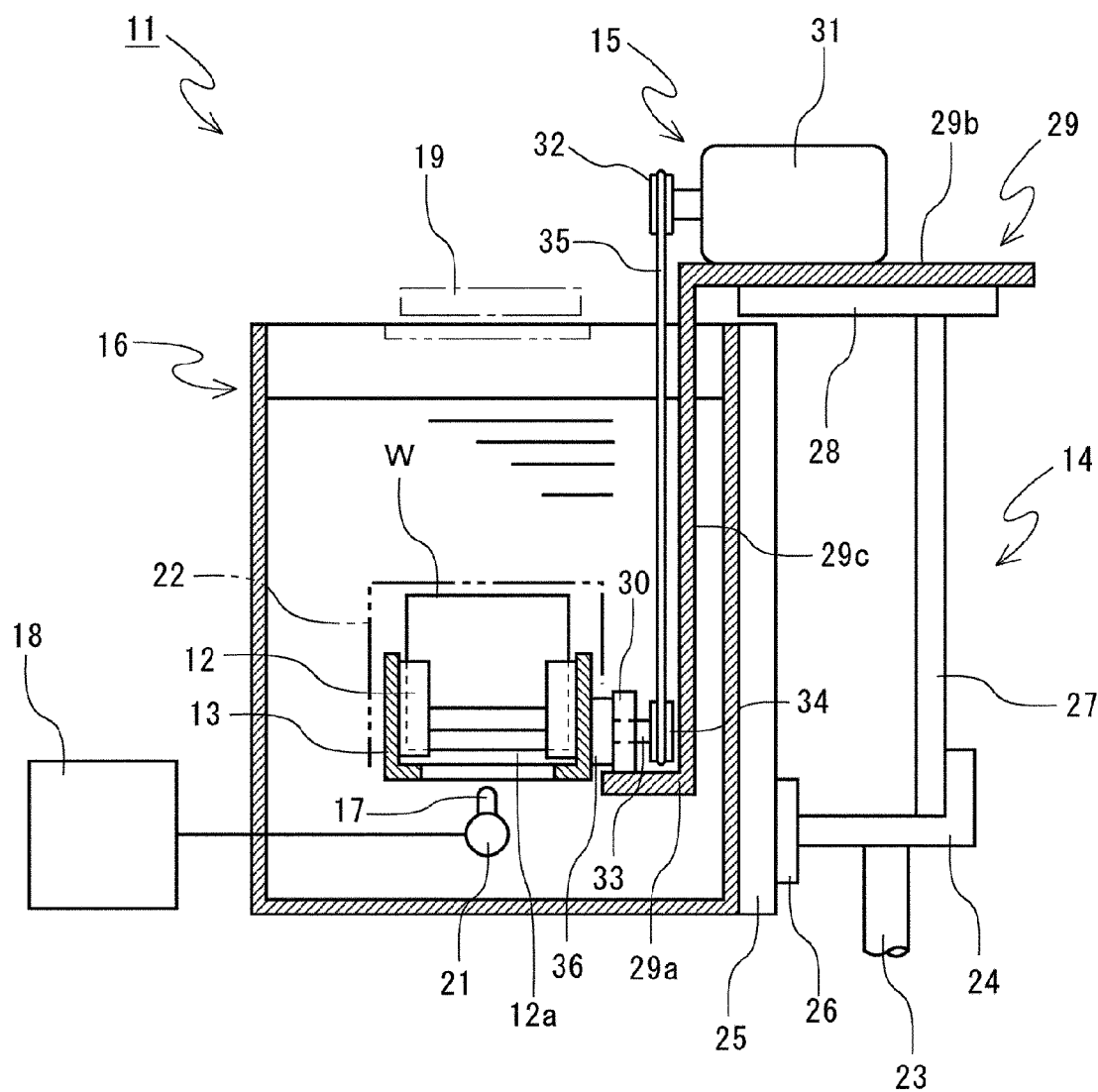
FIG. 2 is a cross sectional view depicting the wafer separation and transfer apparatus in the front side direction, including the wafer separation apparatus according to an embodiment of the present invention in which air bubbles are issued (wafer separation state)
Figure 3:
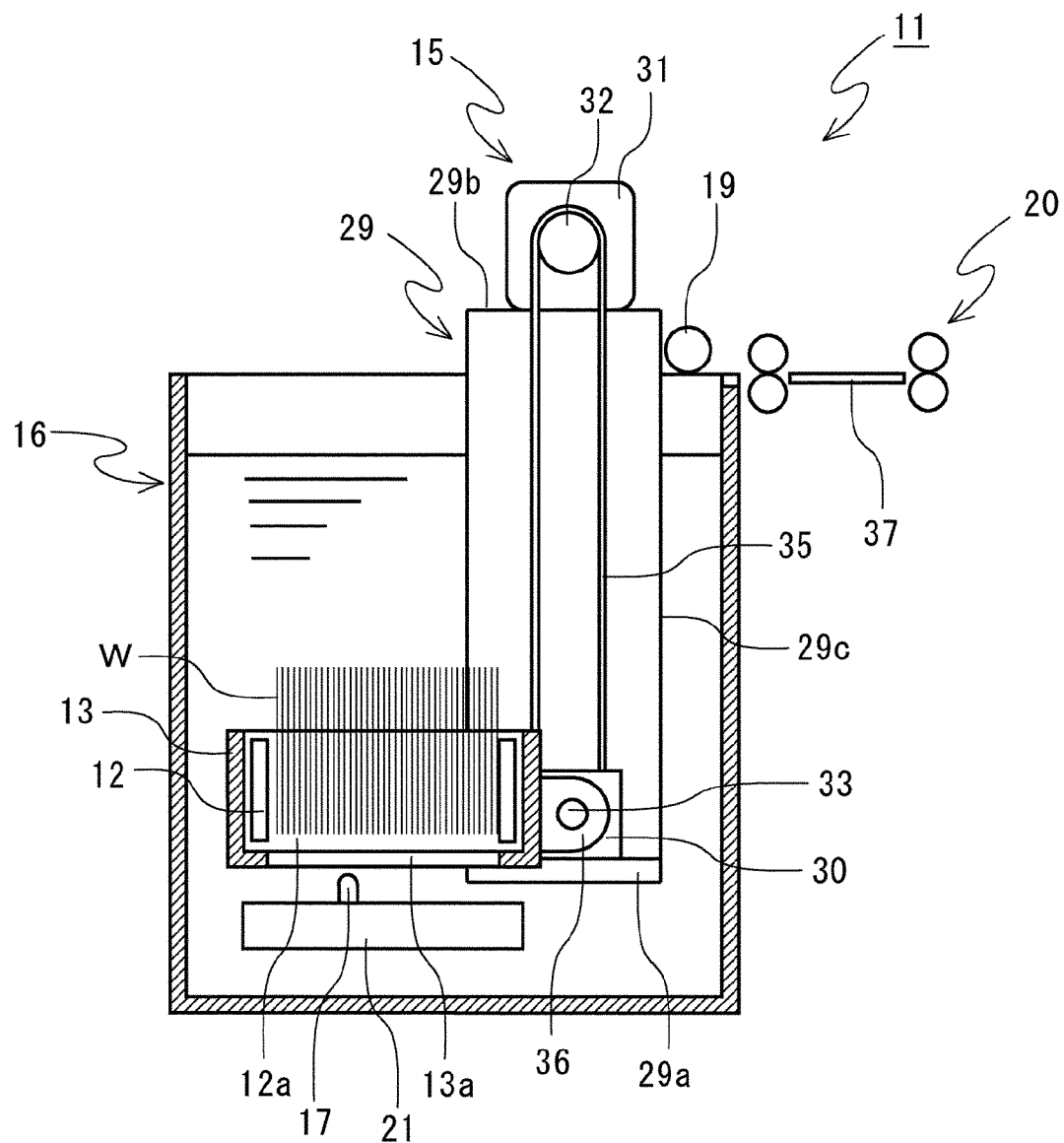
FIG. 3 shows the wafer separation apparatus according to an embodiment of the present invention, (A) is an enlarged cross sectional view depicting the essential part showing the relationship between wafers and air bubbles, and (B) is an illustration depicting an air bubble.
Figure 4:
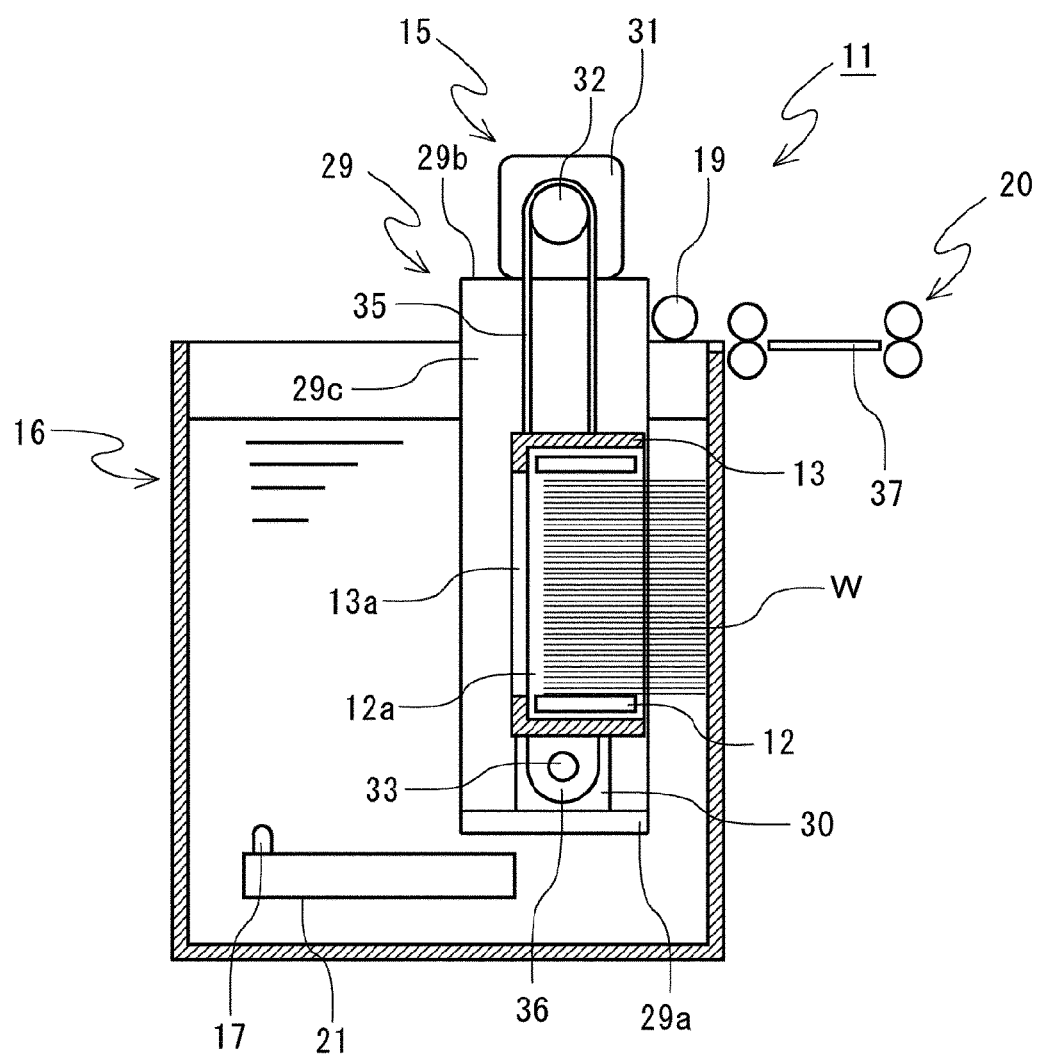
FIG. 4 is a cross sectional view depicting the wafer separation and transfer apparatus in the side direction, including the wafer separation apparatus according to an embodiment of the present invention in which wafers are vertically arranged.
Figure 5:
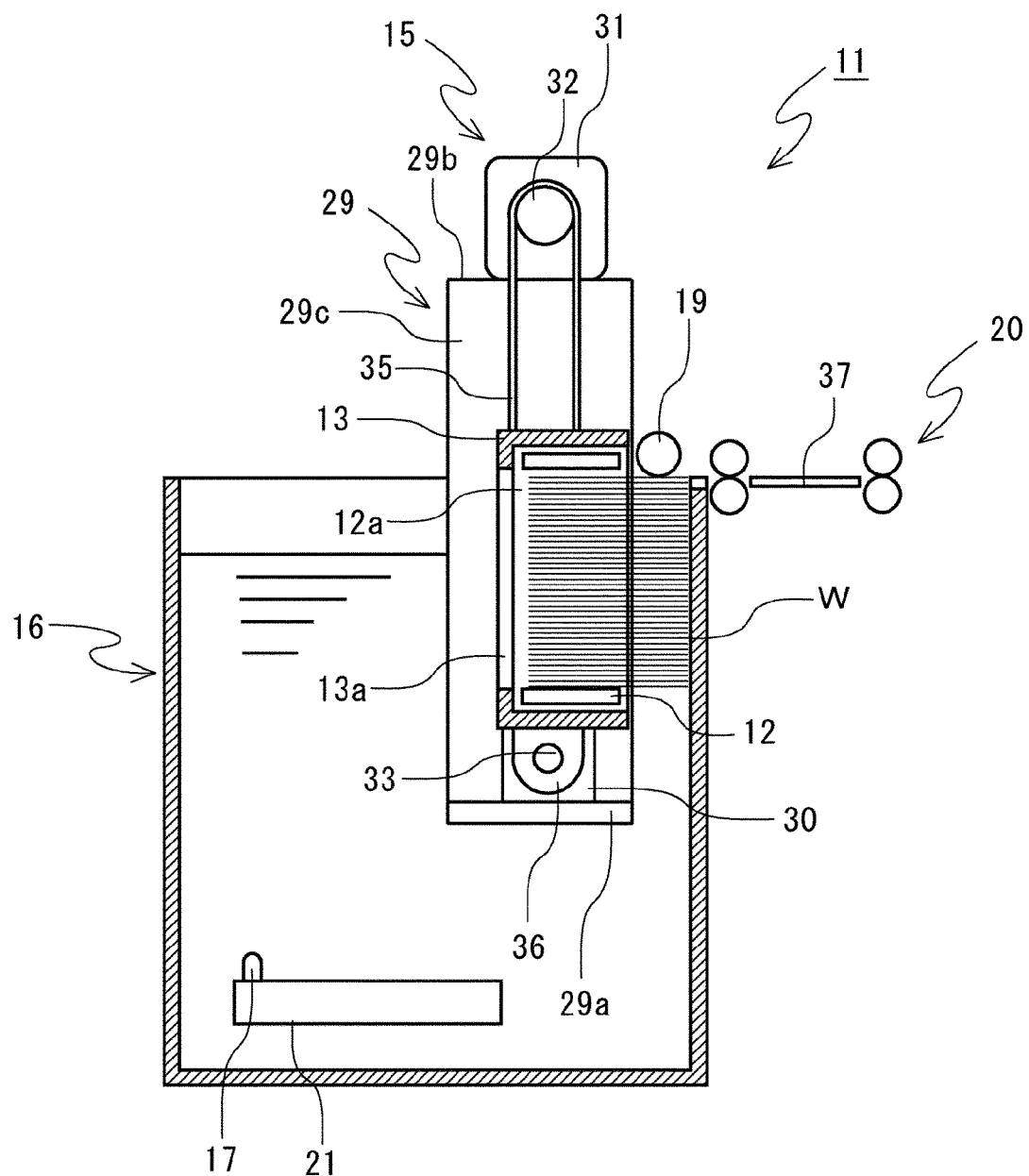
FIG. 5 is an illustration depicting the wafer separation and transfer apparatus, including the wafer separation apparatus according to an embodiment of the present invention in which wafers are horizontally arranged.
Figure 6:
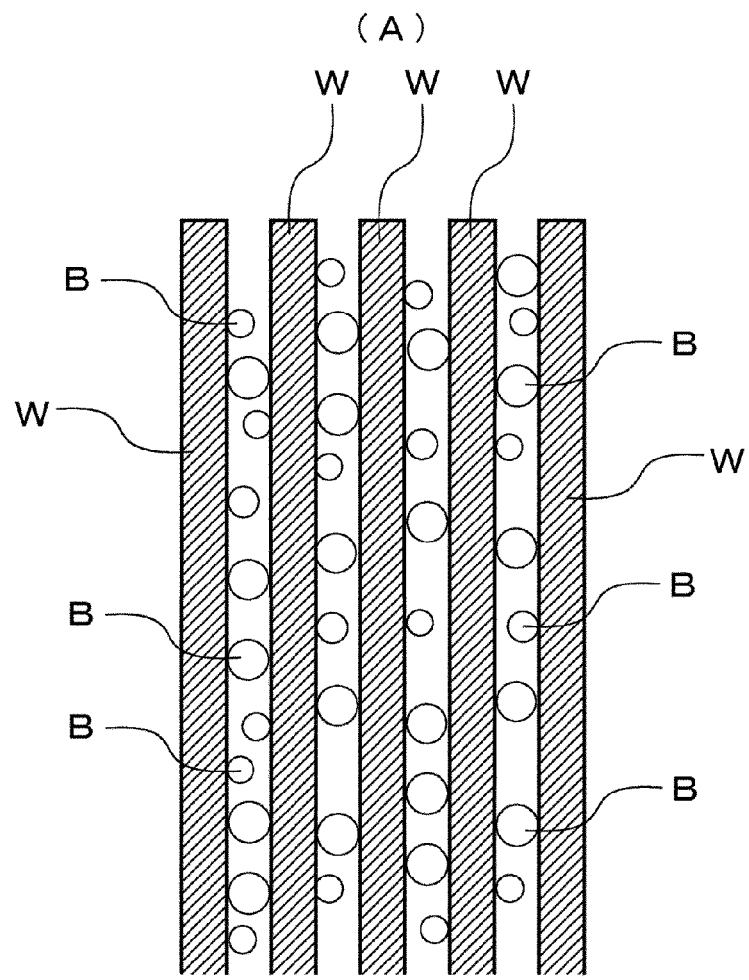
FIG. 6 is an illustration depicting the wafer separation and transfer apparatus, including the wafer separation apparatus according to an embodiment of the present invention as a wafer is carried.
Figure 6:
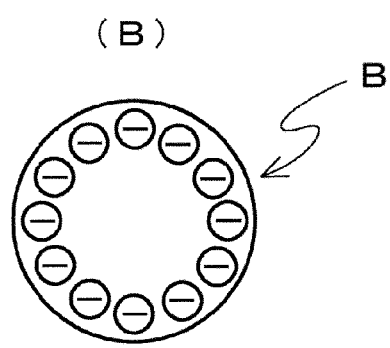
Figure 7:
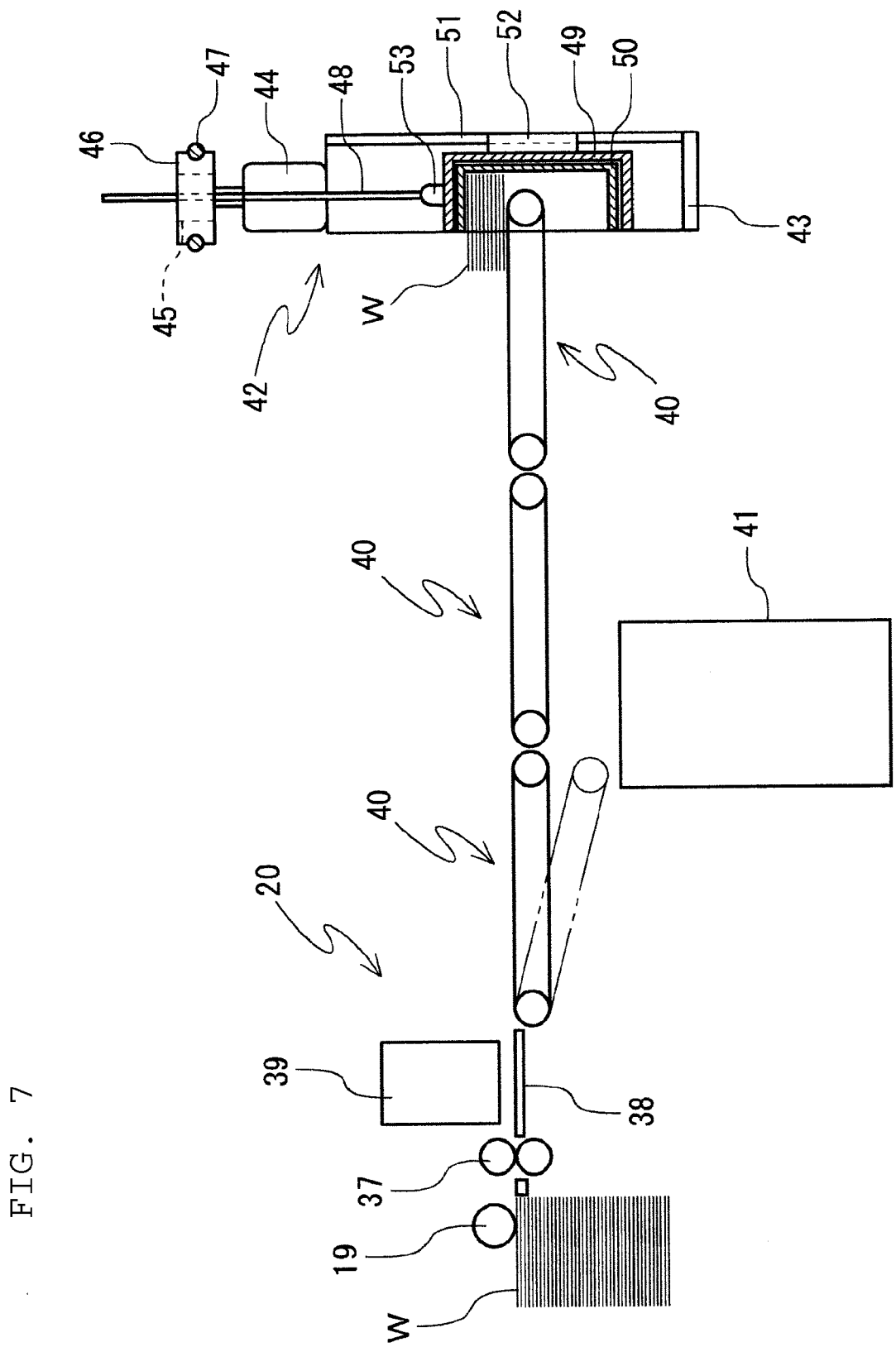
FIG. 7 is an illustration depicting the wafer separation and transfer apparatus according to an embodiment of the present invention.
Figure 8:
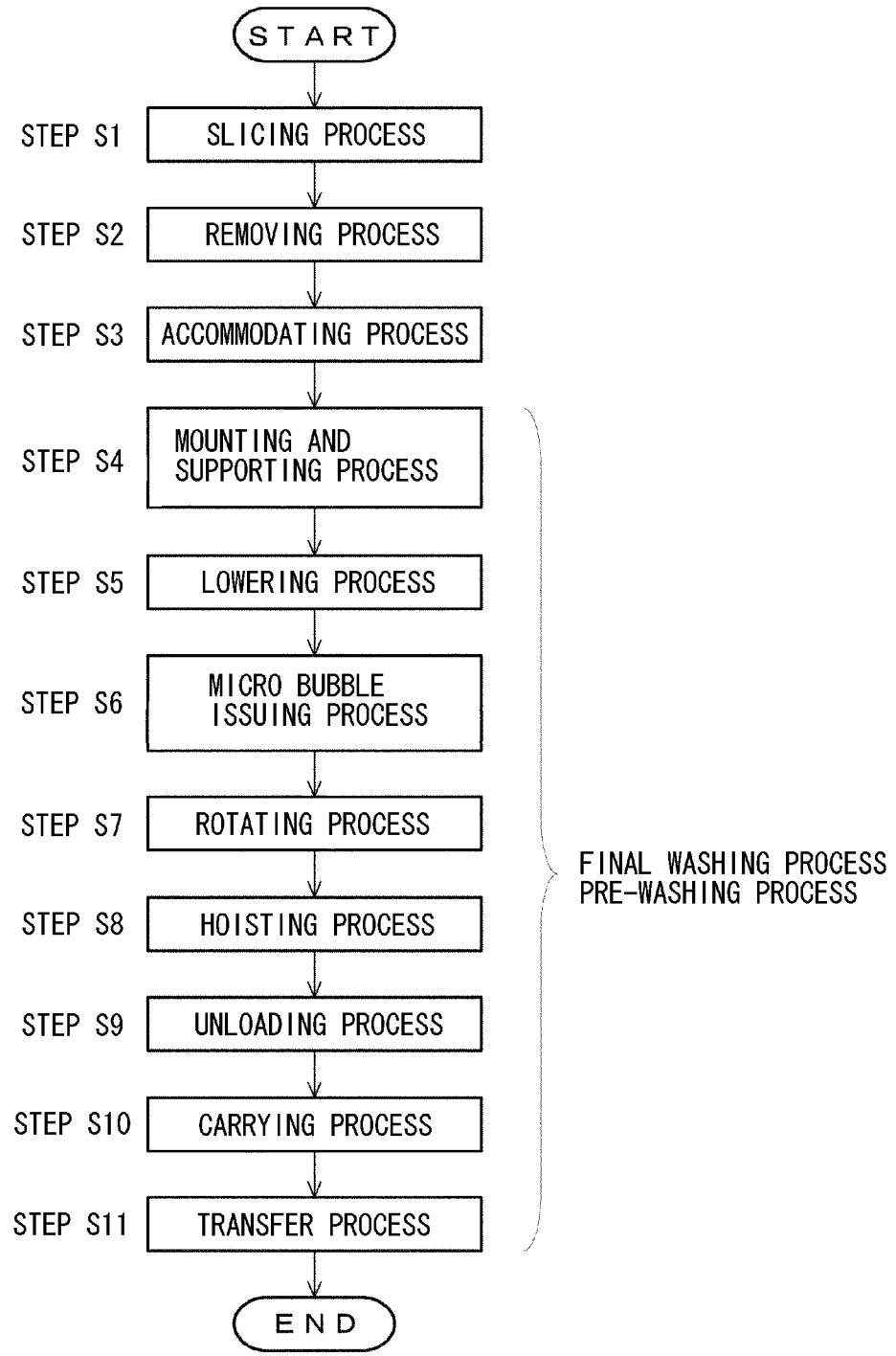
FIG. 8 is a flowchart depicting an operation routine from wafer slicing to separation and transfer for the wafer separation apparatus according to an embodiment of the present invention.
Figure 9:
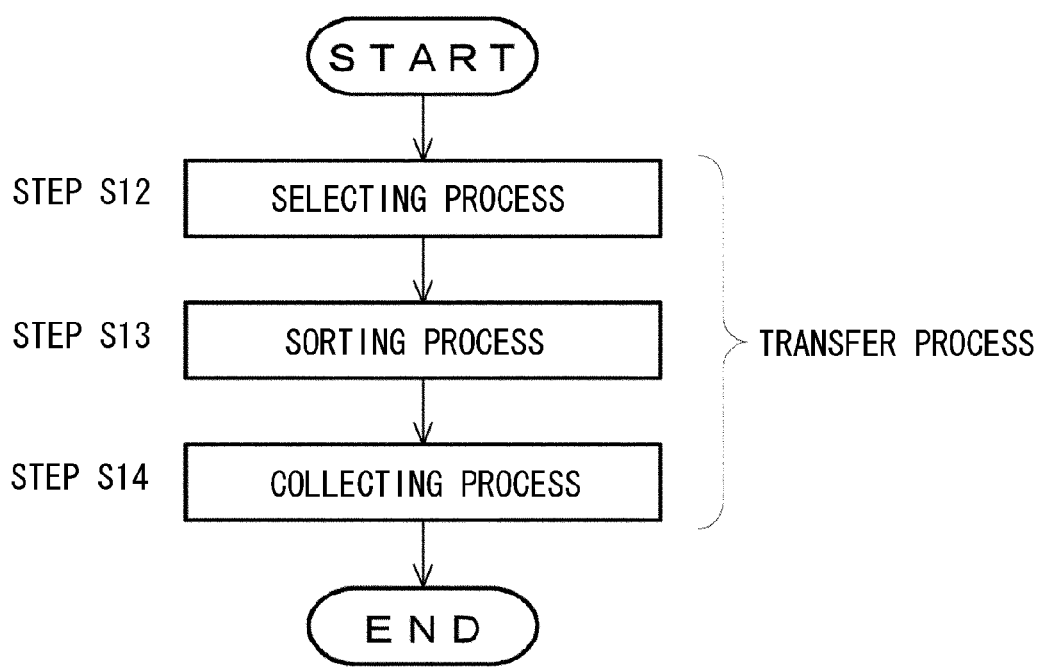
FIG. 9 is a flowchart depicting a transfer operation routine for the wafer separation apparatus according to an embodiment of the present invention.

FIG. 1 is a cross sectional view depicting a wafer separation and transfer apparatus in the front side direction, including the wafer separation apparatus according to an embodiment of the present invention in which wafers are set. FIG. 2 is a cross sectional view depicting the wafer separation and transfer apparatus in the front side direction, including the wafer separation apparatus according to an embodiment of the present invention in which air bubbles are issued (wafer separation state). FIG. 3 shows the wafer separation apparatus according to an embodiment of the present invention; FIG. 3(A) is an enlarged cross sectional view depicting the essential part showing the relationship between wafers and air bubbles, and FIG. 3(B) is an illustration depicting an air bubble. FIG. 4 is a cross sectional view depicting the wafer separation and transfer apparatus in the side direction, including the wafer separation apparatus according to an embodiment of the present invention in which wafers are vertically arranged. FIG. 5 is an illustration depicting the wafer separation and transfer apparatus, including the wafer separation apparatus according to an embodiment of the present invention in which wafers are horizontally arranged. FIG. 6 is an illustration depicting the wafer separation and transfer apparatus, including the wafer separation apparatus according to an embodiment of the present invention as a wafer is carried. FIG. 7 is an illustration depicting the wafer separation and transfer apparatus according to an embodiment of the present invention. FIG. 8 is a flowchart depicting an operation routine from wafer slicing to separation and transfer for the wafer separation apparatus according to an embodiment of the present invention.

As shown in FIGS. 1 to 5, a wafer separation and transfer apparatus 11 including the wafer separation apparatus according to an embodiment of the present invention has a cassette 12 that vertically accommodates a large number of single wafers W in intimate contact with each other and is at least vertically opened, a cassette support 13 that removably support the cassette 12 and is at least vertically opened, a hoisting unit 14 that hoists and lowers the cassette support 13 integrally with the cassette 12, a rotating unit 15 provided on the hoisting unit 14 for rotating the cassette support 13 integrally with the cassette 12 so as to switch the wafers W accommodated in the cassette 12 between the states in which they are vertically arranged and they are horizontally arranged, a liquid bath 16 that accommodates a liquid thereinside into which the cassette support 13 is immersed integrally with the cassette 12 when the hoisting unit 14 descends, a nozzle 17 provided in the liquid bath 16 for issuing micro bubbles from the underside of the cassette support 13 toward a large number of the wafers W, a micro bubble generator 18 that generates micro bubbles to be issued from the nozzle 17, an unloading member 19 that unloads a topmost one out of the wafers W horizontally arranged and hoisted from the inside of the liquid bath 16, and a carrier unit 20 that carries the topmost wafer W unloaded by the unloading member 19.

According to the wafer separation and transfer apparatus 11 thus configured, it is possible to improve separation performance of the wafers W in separation and transfer and it is possible to suppress the occurrence of breakage or the like of the wafers W in separation and transfer, while the apparatus is an inexpensive, small-sized apparatus.

At this time, the wafer separation and transfer apparatus 11 includes a moving unit 21 that moves the nozzle 17 or the cassette support 13 along the direction of arranging the wafers W, so that it is possible to cause micro bubbles to be uniformly issued toward the space between the individual wafers W.

Moreover, a cover 22 is provided to cover five sides except the underside of the cassette support 13, which is immersed in the liquid bath 16, so that it is possible to facilitate causing micro bubbles to enter the space between the individual wafers W.

Furthermore, the micro bubble generator 18 causes the nozzle 17 to issue negatively charged micro bubbles, so that it is possible to cause micro bubbles to enter the space between the wafers W so that the micro bubbles are brought into the space between the wafers W, if the space between the wafers W, which are sliced with the wire-saw 3, is positively charged.

In addition, preferably, the micro bubble generator 18 causes the nozzle 17 to issue a micro bubble having a diameter equal to a groove width or less when the ingot is sliced with the wire-saw 3. More preferably, it causes the nozzle 17 to issue a micro bubble having a diameter equal to or less than the wire diameter of the wire 4 used in the wire-saw 3, which is used in slicing the silicon ingot 1 into single wafers. Furthermore preferably, it causes the nozzle 17 to issue a micro bubble having a diameter of 100 μm or less. The best is that it causes the nozzle 17 to issue a micro bubble having a diameter of 20 μm or less on average.

In addition, preferably, the cassette 12 vertically accommodates a large number of the single wafers W in intimate contact with each other so that the running direction of the wire-saw 3 used in slicing the silicon ingot 1 into single wafers is the same as the directions of unloading and carrying the wafer W with the unloading member 19 and the carrier unit 20.

In the following, the specific configuration of the wafer separation and transfer apparatus 11 according to the present invention will be described.

The cassette 12 is not limited in shapes, materials, or the like as the strength is secured particularly, as long as the cassette 12 is capable of accommodating a large number of the wafers W and is formed with a lower opening 12a for passing micro bubbles issued from the nozzle 17 therethrough. In addition, in this embodiment, the cassette 12 is designed in which the cassette 12 is also opened upward so that the cassette 12 can accommodate the wafers W and the height is lower than the height of the wafers W (when they are vertically arranged) so that the unloading member 19 can contact with a topmost wafer W horizontally arranged in unloading the wafer W, described later.

The cassette support 13 is not limited in shapes, materials, or the like as the strength is secured particularly, as along as the cassette support 13 is capable of attaching, detaching, and supporting the cassette 12 thereon and is formed with a lower opening 13a for passing micro bubbles issued from the nozzle 17 therethrough. In addition, in this embodiment, the cassette support 13 is designed in which the cassette support 13 is also opened upward so that the cassette support 13 can accommodate the cassette 12 and the height is lower than the height of the wafers W (when they are vertically arranged) so that the unloading member 19 can contact with a topmost wafer W horizontally arranged in unloading the wafer W, described later.

The hoisting unit 14 includes a shaft 23 that is extended by drive of a hoisting and lowering drive unit, not shown, (for example, a solenoid), an intermediate support 24 fixed to the top end of the shaft 23, a guide rail 25 vertically extended and fixed to the side wall of the liquid bath 16, a guide plate 26 provided on the intermediate support 24 and guided by the guide rail 25, a fixed shaft 27 erected from the intermediate support 24, a fixed base 28 in a crank shape in the cross section fixed to the top end of the fixed shaft 27, a support base 29 in a crank shape in the cross section fixed to the fixed base 28, and a shaft support part 30 fixed to a lower plate 29a of the support base 29.

In addition, because the guide rail 25 and the guide plate 26 support the rotating unit 15 and the cassette 12 with the fixed shaft 27 as one side is opened, they are designed to slide at the positions in consideration of the weight balance (in the lateral direction of FIG. 1).

In addition, the support base 29 integrally includes an upper plate 29b fixed to the top side of the fixed base 28 and having the tip end protruded in the inside of the liquid bath 16, a vertical plate 29c extended downwards from the tip end of the upper plate 29b, and the horizontal lower plate 29a bent at a right angle from the lower end of the vertical plate 29c toward the inner side of the liquid bath 16. The support base 29 is formed of these plates 29a, 29b, and 29c in a nearly crank shape in the cross section.

The rotating unit 15 includes a drive motor 31 fixed to the upper plate 29b and having the output shaft extended toward the inside of the liquid bath 16, a drive pulley 32 provided on the drive motor 31, a rotating shaft 33 that penetrates through the shaft support part 30, an idler pulley 34 provided on one end of the rotating shaft 33, an endless belt 35 rotatably and movably extended between the pulleys 32 and 34, and a rotating arm 36 provided on the other end of the rotating shaft 33. The cassette support 13 is fixed to this rotating arm 35.

Moreover, the drive of the drive motor 31 causes the rotating arm 35 to turn for rotating the cassette 12 integrally with the cassette support 13. As shown in FIG. 3, the individual wafers W accommodated in the cassette 12 are vertically arranged when the cassette support 13 is laid (in the horizontal state), and as shown in FIG. 4, the wafers W accommodated in the cassette 12 are horizontally arranged when the cassette support 13 is erected (in the vertical state).

Furthermore, the rotating arm 35 is designed to come close to the position at which the top edge of the wafers W accommodated in the cassette 12 (when vertically arranged) is brought into nearly contact with the inner wall surface of the liquid bath 16 when the rotating arm 35 is erected. In addition, when the rotating arm 35 is brought close to the position at which the top edge of the wafers W (when vertically arranged) is brought into nearly contact with the inner wall surface of the liquid bath 16 as the rotating arm 35 is erected, it is possible to eliminate the event that micro bubbles B entering the space between the wafers W, described later, cause the individual wafers W to move unexpectedly.

The liquid bath 16 accommodates a liquid such as pure water thereinside, and has such depth that the hoisting unit 14 lowers the wafers W accommodated in the cassette 12 to be completely immersed. Moreover, in this embodiment, the depth of the liquid bath 16 is designed to have such depth (at least the liquid level) that the wafers W are completely immersed even in the state in which the hoisting unit 14 erects the cassette support 13 as the hoisting unit 14 is positioned at the bottom dead center. Furthermore, it is possible to suitably select the liquid accommodated in the liquid bath 16 except volatility, in consideration that it is necessary to cause micro bubbles, described later, to stay in the space between the wafers W for a while. For example, in the case of combining secondary washing, it is possible to use a secondary washing fluid or the like.

The nozzle 17 is provided near the deepest part of the liquid bath 16. The number or the like thereof is not limited particularly as long as it can issue micro bubbles generated in the micro bubble generator 18.

The micro bubble generator 18 includes a pump, mixer, both are not shown, or the like, for example, for which a publicly known one is used, in which pressure is set to change and adjust the air bubble diameter of micro bubbles to be generated. In addition, in this embodiment, the air bubble diameter is 100 μm or less. Strictly speaking, as shown in FIG. 6(A), the structure or the like is not limited particularly as long as it can generate so-called nanobubbles, which the average air bubble diameter of micro bubbles B entering the space between the wafers W is around 20 μm.

At this time, in the micro bubble generator 18, the inner side of the air bubble is negatively (−) charged, as shown in FIG. 6(B).

Thus, because slurry or the like, which is removed in pre-washing or secondary washing, for example, is positively charged, it is possible to efficiently cause micro bubbles to enter the space between the wafers W by the effect of drawing the negatively charged micro bubbles, as it is considered that the space between the wafer W or the like is positively charged, including the case where this slurry remains after secondary washing.

For the unloading member 19, a roller member or the like is used, which is rotated by drive of a drive motor, not shown, or the like (in the counterclockwise direction in FIG. 1), and for the material or the like, there is used such one that has elasticity and a relatively high frictional resistance (for example, urethane). In addition, the unloading member 19 is formed of a single roller member in this embodiment. However, it is possible to design the position and number of the unloading member 19 in consideration of the transfer range of the wafer W.

As shown in FIG. 7, the carrier unit 20 includes a vertical pair of roller members 37 that nip and carry the wafer W by individually turning in the reverse direction using the drive motor also serving to rotate the unloading member 19 or using a separate device, a transfer support plate 38 provided next to the roller members 37 on the downstream side of the transfer direction, a defect determining device 39 provided above the transfer support plate 38, a plurality of transfer belt conveyors 40 provided next to the transfer support plate 38 on the downstream side of the transfer direction, a diverging device 41 that discards and collects a wafer W determined that the wafer W has a defect by the defect determining device 39 at any positions on the transfer belt conveyor 40, and a collecting device 42 that collects a wafer W with no defect. Moreover, for the transfer support plate 38 and the transfer belt conveyor 40, a material with elasticity and a relatively high frictional resistance is used (for example, urethane). Furthermore, the diverging device 41 temporarily breaks the transfer path as a part of the transfer belt conveyor 40 is tilted, for example, (in the state depicted by a chain double-dashed line in FIG. 8), and discards and collects wafers W at the position of breaking the path on the downstream side of the transfer direction. At this time, the wafers W discarded and collected are recycled.

The defect determining device 39 determines whether cracks (cracking, chipping, or the like) occur by imaging processes using a CCD camera.

The collecting device 42 includes a cabinet 43, a servo motor 44 provided on the cabinet 43, a drive pulley 45 provided on the output shaft of the servo motor 44, an idler pulley 46 rotatably supported on the cabinet 43, a belt 47 rotatably and movably provided on the pulleys 45 and 46, a ball screw 48 that penetrates through the idler pulley 46 and is vertically displaced by the rotation of the idler pulley 46, a hoisting and lowering member 49 coupled to one end of the ball screw 48, and a wafer collection box 50 removably mounted on the hoisting and lowering member 49.

The front side of the wafer collection box 50 is opened, and a partition such as a slit, not shown, is provided so as to accommodate each one of the wafers W after washed as they are separated from each other. Moreover, on the rear side of the hoisting and lowering member 49, a guide projection 52 is provided to engage with the guide rail 51 installed on the cabinet 43. Furthermore, on the topside of the hoisting and lowering member 49, a coupling part 53 is provided, to which one end of the ball screw 48 is rotatably coupled.

With this configuration, the wafers W carried on the transfer belt conveyors 40 are collected and accommodated one by one from above the wafer collection box 50 as they are separated into single wafers, and the wafers W are collected and accommodated in each partition while the wafer collection box 50 is sequentially displaced upward by the inching drive of the servo motor 44.

At this time, preferably, the downstream end of the transfer belt conveyor 40 placed on the most downstream side in the wafer transfer direction faces the inside of the wafer collection box 50.

Moreover, the drive pulley 45 and the idler pulley 46 are adjusted as similar to the adjustment of the gear ratio by changing the diameter. Furthermore, a solenoid or the like may be used for the servomotor 44, the idler pulley 46, the belt 47, and the ball screw 48.

The moving unit 21 horizontally moves the nozzle 17 along the direction of arranging the wafers W, which moves it at a rate of 5.0 mm/sec, for example. In addition, it is also possible that this moving unit 21 horizontally moves the cassette 12 along the direction of arranging the wafers W instead of moving the nozzle 17.

The cover 22 covers five sides of the cassette support 13 except the underside with less clearance, which contains the micro bubbles issued from the nozzle 17 inside the cover 22 to facilitate causing micro bubbles to enter the space between the individual wafers W. Moreover, materials, shapes, or the like of the cover 22 are not limited particularly. Furthermore, the cover 22 is removed while the hoisting unit 14 is hoisting and lowering the cassette 12, or in the state in which the cassette support 13 is rotated and erected.

In the above-mentioned configuration, the wafers W are subjected to the following steps. A slicing step of slicing the silicon ingot 1 integrally with the support plate 10 into a large number of wafers (Step S1), a removing step of removing the sliced silicon ingot 1 from the support plate 10 for single wafers (Step S2), an accommodating step of vertically accommodating a large number of the removed single wafers W in the cassette 12 in intimate contact with each other, the cassette 12 being at least vertically opened (Step S3), a mounting and supporting step of mounting and supporting the cassette 12 on the cassette support 13 that is at least vertically opened (Step S4), a lowering step of lowering the cassette support 13 integrally with the cassette 12 using the hoisting unit 14 and immersing the wafers W vertically arranged in a liquid in the inside of the liquid bath 16 (Step S5), a micro bubble issuing step of issuing micro bubbles generated in the micro bubble generator 18 from the nozzle 17 from the underside of the cassette support 13 toward the wafers W vertically arranged and causing the micro bubbles to enter and stay in the space between a large number of the wafers W (Step S6), a rotating step of rotating the cassette support 13 integrally with the cassette 12 to horizontally arrange a large number of the wafers W using the rotating unit 15 while the micro bubbles enter and stay in the space between a large number of the wafers W (Step S7), a hoisting step of hoisting the cassette support 13 integrally with the cassette 12 as the wafers W are horizontally arranged using the hoisting unit 14 and lifting a topmost wafer W above at least the liquid level of the liquid bath 16 (Step S8), an unloading step of unloading the topmost wafer W lifted above the liquid level (Step S9), a carrying step of carrying the unloaded wafer W (Step S10), and a transfer step of transferring the carried wafer W to a solar cell fabrication apparatus (Step S11). Through these steps, it is possible to transfer the wafers W as solar cell wafers to fabrication processes, such as the transfer of the wafers W to a chemical etching apparatus for texture treatment to fabricate p-type wafers W or n-type wafers W, for example.

More specifically, after the silicon ingot 1 is sliced using the wire-saw 3 in Step S1, the sliced silicon ingot 1, which is still supported by the support 10, is passed from the wire-saw 3 through a publicly known pre-washing device and secondary washing device for removing slurry or the like as well as for removing the support 10, and then the wafers W become single wafers (Step S2).

For the individual single wafers W, a large number of the wafers W are accommodated in the cassette 12 in intimate contact with each other, with the use of the cassette 12 or the like, which has been so far used in manual operations of washing, removing, and separation (Step S3), and the cassette 12 is mounted and supported on the cassette support 13 as the cassette 12 is carried in the wafer separation and transfer apparatus 11 depending on factories or the like (Step S4).

After that, the solenoid or the like is driven to lower the cassette support 13 into the liquid bath 16 having the liquid in advance accommodated thereinside to the bottom dead center at which the wafers W are completely immersed (Step S5).

Subsequently, the micro bubble generator 18 is driven to cause micro bubbles having an air bubble diameter of 20 μm on average to be issued from the nozzle 17, and the micro bubbles (nanobubbles) B having an average air bubble diameter of 20 μm are caused to enter the space between the individual wafers W while the nozzle 17 is moved at a predetermined rate (Step S6).

Moreover, after the micro bubbles B enter all the spaces between the wafers W, the drive motor 31 is driven to turn the rotating shaft 33 by rotating and moving the endless belt 35, and the cassette support 13 is erected in association with the rotation of the rotating arm 36 (Step S7).

After that, the cassette support 13 is hoisted to a predetermined unloading position at which the topmost wafer W is positioned above the top edge of the liquid bath 16, and the cassette support 13 is stopped at this predetermined unloading position (Step S8).

The unloading member 19 is then contacted with the topmost wafer W, and the unloading member 19 is rotated to unload the topmost wafer W (Step S9). The topmost wafer W is nipped and carried by the carrier unit 20 (Step S10), and the topmost wafer W is transferred to the collecting device 42 (Step S11).

Moreover, these Steps S9 to S11 are also performed to a topmost wafer W after the subsequent stage one by one, and the hoisting unit 14 hoists the lower set support 13 as necessary, (for example, as for three wafer each).

Furthermore, in the transfer process in Step 11, a defect on the wafer W is determined by the defect determining device 39 (Step S12). If a defect occurs, a faulty wafer W is diverged (ejected) by the diverging device 41 (Step S13), and wafers W with no defect are in turn collected in the wafer collection box 50 by the collecting device 42 (Step S14).

Figure 10:
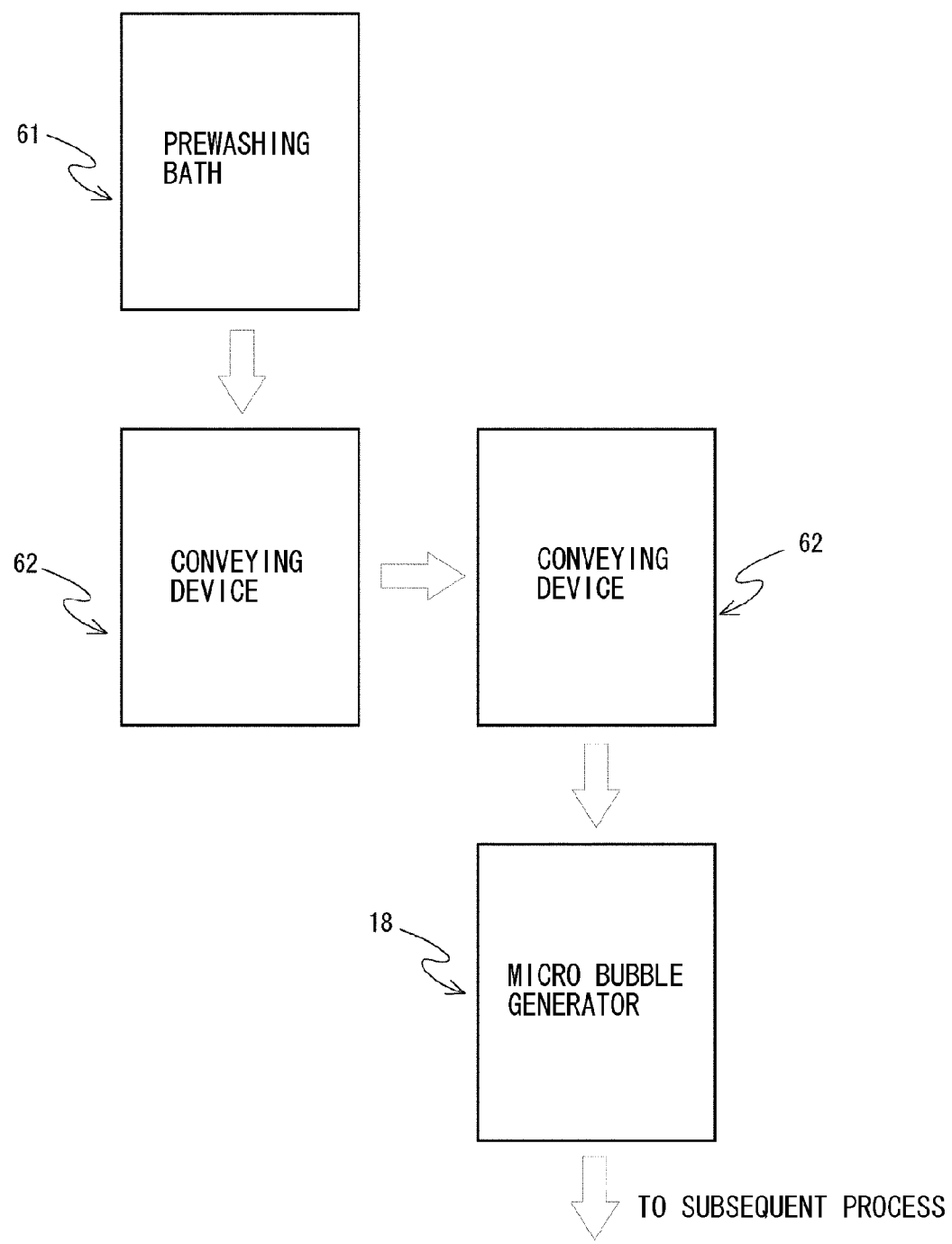
FIG. 10 is an illustration of the apparatus layout of the wafer separation apparatus according to an embodiment of the present invention, including pre-washing.

Moreover, in this embodiment, the wafers W, which are sliced into a large number of wafers with the wire-saw 3, are directly separated and carried. However, as shown in FIG. 10, such a configuration is possible that a pre-washing bath (pre-washing device) 61 is used as a device equivalent to the micro bubble generator 18 shown in the present invention, in which the wafers W accommodated in the cassette 12 passed from Step S1 through Step S3 are pre-washed, and they are then separated and carried through one or more of conveying devices 62.

Furthermore, it is also possible that the wafers W after collected in the wafer collection box 50 are automatically transferred in the wafer collection box 50 as a whole using a multi-robot arm, not shown, and they are transferred to a device for the subsequent process step (final washing or mirror-like finishing).

As described above, in accordance with the wafer separation apparatus according to the present invention, the micro bubbles B are caused to enter the space between a large number of the individual wafers W, which are removed from the support 10, so that it is possible to suppress sticking between the individual wafers W and to efficiently perform the separating operation.

In addition, the micro bubbles B just enter the space between the individual wafers W, thereby separating the wafers W into single wafers. Thus, it is possible to suppress the occurrence of breakage or the like caused by forced separation (for example, a jet of pressure water or the like).

Now, in the above-mentioned embodiment, although explanation is made in which the wafer separation apparatus according to the present invention is adapted to the silicon single crystal wafer, it is also possible to apply the apparatus to polysilicon wafers.

At this time, for the polysilicon wafer, a rectangular polysilicon ingot is cut into a rectangular polysilicon block using a band saw or the like, for example, and the ingot is subjected to the finishing process such as sizing, etching, or the like, and then the ingot is sliced with the above-mentioned wire-saw or the like.

INDUSTRIAL APPLICABILITY

As discussed above, according to the present invention, it is possible to provide a wafer separation apparatus that can improve wafer separation performance in separation and transfer and can suppress the occurrence of breakage or the like of wafers in separation and transfer while the apparatus is an inexpensive, small-sized apparatus.

The invention claimed is:

1. A wafer separation apparatus comprising:
a cassette configured to vertically accommodate therein a large number of single wafers in intimate contact with each other, the cassette being at least vertically opened;
a cassette support configured to removably support the cassette, the cassette support being at least vertically opened;
a hoisting unit configured to hoist and lower the cassette support integrally with the cassette;
a liquid bath configured to accommodate a liquid thereinside into which the cassette support is immersed integrally with the cassette when the hoisting unit descends;
a nozzle provided in the inside of the liquid bath for issuing micro bubbles from an underside of the cassette support toward a large number of the wafers; and
a micro bubble generator configured to generate micro bubbles to be issued from the nozzle.

2. A wafer separation and transfer apparatus comprising:
a cassette configured to vertically accommodate therein a large number of single wafers in intimate contact with each other, the cassette being at least vertically opened;
a cassette support configured to removably support the cassette, the cassette support being at least vertically opened;
a hoisting unit configured to hoist and lower the cassette support integrally with the cassette;
a rotating unit provided on the hoisting unit for rotating the cassette support integrally with the cassette so as to switch the wafers accommodated in the cassette between a state in which the wafers are vertically arranged and a state in which the wafers are horizontally arranged;
a liquid bath configured to accommodate a liquid thereinside into which the cassette support is immersed integrally with the cassette when the hoisting unit descends;
a nozzle provided in the inside of the liquid bath for issuing micro bubbles from an underside of the cassette support toward a large number of the wafers;
a micro bubble generator configured to generate micro bubbles to be issued from the nozzle;
an unloading member configured to unload a topmost wafer from the horizontally arranged wafers hoisted from the inside of the liquid bath; and
a carrier unit configured to carry the topmost wafer unloaded by the unloading member.

3. The wafer separation and transfer apparatus according to claim 2, wherein the carrier unit includes:
a defect determining device provided near an upstream side of a transfer path for determining a defect on a wafer being carried;
a diverging device provided on a downstream side of the transfer path more than the defect determining device for diverging a wafer determined that the wafer has a defect to a discard route different from a carrying route; and
a collecting device configured to collect a wafer determined that the wafer has no defect by the defect determining device.

4. The wafer separation apparatus according to claim 1, comprising a moving unit configured to move the nozzle or the cassette support along a direction of arranging the wafers.

5. The wafer separation apparatus or the wafer separation and transfer apparatus according to claim 1, comprising a cover configured to cover five sides except the underside of the cassette support as the cassette support is immersed in the inside of the liquid bath.

6. The wafer separation apparatus or the wafer separation and transfer apparatus according to claim 1,
wherein the micro bubble generator causes the nozzle to issue negatively charged micro bubbles.

7. The wafer separation apparatus or the wafer separation and transfer apparatus according to claim 1,
wherein the micro bubble generator causes the nozzle to issue a micro bubble having a diameter equal to a width of a groove or less, the groove being cut with a wire-saw used in slicing a silicon ingot into single wafers.

8. The wafer separation apparatus or the wafer separation and transfer apparatus according to claim 1,
wherein the micro bubble generator causes the nozzle to issue a micro bubble having a diameter equal to a wire diameter of a wire-saw or less, the wire-saw being used in slicing a silicon ingot into single wafers.

9. The wafer separation apparatus or the wafer separation and transfer apparatus according to claim 1,
wherein the micro bubble generator causes the nozzle to issue a micro bubble having a diameter of 100 µm or less.

10. The wafer separation apparatus or the wafer separation and transfer apparatus according to claim 1,
wherein the micro bubble generator causes the nozzle to issue a micro bubble having a diameter of 20 µm or less on average.

11. The wafer separation and transfer apparatus according to claim 2,
wherein the cassette vertically accommodates therein a large number of the single wafers in intimate contact with each other so that a running direction of the wire-saw used in slicing a silicon ingot into single wafers is the same as wafer unloading and transfer directions of the unloading member and the carrier unit.

12. The wafer separation and transfer apparatus according to claim 2,
wherein the rotating unit supports the cassette support so that a top edge of the wafers comes close to a vertical inner wall surface of the liquid bath in the state in which the wafers are vertically arranged and accommodated in the cassette when the cassette support is erected.

* * * * *